United States Patent [19]

Kim et al.

[11] Patent Number: 5,801,099
[45] Date of Patent: Sep. 1, 1998

[54] METHOD FOR FORMING INTERCONNECTION OF SEMICONDUCTOR DEVICE

[75] Inventors: Yong Kwon Kim, Chungcheongbuk-do; Nae Hak Park, Seoul, both of Rep. of Korea

[73] Assignee: LG Semicon Co., Ltd., Chungcheongbuk-do, Rep. of Korea

[21] Appl. No.: 712,606

[22] Filed: Sep. 13, 1996

[30] Foreign Application Priority Data

Apr. 12, 1996 [KR] Rep. of Korea .................. 11061/1996

[51] Int. Cl.$^6$ .................. H01L 21/441; H01L 21/475
[52] U.S. Cl. .................. 438/666; 438/637; 438/700; 438/638
[58] Field of Search .................. 437/195, 235, 437/228, 229; 438/666, 668, 637, 673, 700, 640, 638

[56] References Cited

U.S. PATENT DOCUMENTS

| | | | |
|---|---|---|---|
| 5,296,410 | 3/1994 | Yang | 437/228 |
| 5,328,553 | 7/1994 | Poon | 156/636 |
| 5,382,545 | 1/1995 | Hong | 437/195 |
| 5,461,004 | 10/1995 | Kim | 437/195 |
| 5,705,430 | 1/1998 | Avanzino et al. | |
| 5,710,061 | 1/1998 | Cleeves | |

*Primary Examiner*—Caridad Everhart
*Attorney, Agent, or Firm*—Morgan, Lewis & Bockius LLP

[57] ABSTRACT

A method of forming an interconnection for a semiconductor device includes the steps of: forming a lower conductive line on a semiconductor substrate and forming a first insulating layer on the semiconductor substrate and the lower conductive line; patterning the first insulating layer to form a first insulating layer pattern which is narrower than the lower conductive line on the lower conductive line; forming a second insulating layer on an overall surface of the substrate and on the first insulating layer pattern, to planarize a surface of the second insulating layer; patterning the second insulating layer to expose a surface of the first insulating layer pattern and to form a first trench wider than the first insulating layer pattern on an upper portion of the first insulating pattern; removing the first insulating layer pattern, to thereby form a second trench at a lower portion of the first trench; and filling the first and second trenches with conductive material, to thereby form an upper conductive line.

20 Claims, 3 Drawing Sheets

METHOD FOR FORMING INTERCONNECTION OF SEMICONDUCTOR DEVICE

BACKGROUND OF THE INVENTION

1. Field of the Invention

The present invention relates to a method of forming an interconnection for a semiconductor device and, more particularly, to a method of forming an interconnection for a semiconductor device suitable for facilitating its manufacturing process, for enhancing productivity, and for forming a plane line.

2. Discussion of the Related Art

Generally, given the tendency toward higher integration of semiconductor devices, a method has been used for reducing the width of a line in order to decrease the dimensions of high-density devices. However, this method commonly has current capacity or line resistance limitations.

In order to overcome the drawbacks of such a method, an interconnection technique has been introduced to reduce the dimensions of each device without reducing the line width. However, this interconnection technique also has a problem in that a steplike difference of the surface is increased so that the line is multi-layered. This may have an effect on the yield or reliability of the device. Therefore, a chemical mechanical polishing (CMP) method was suggested to planarize the surface of the device. An indirect pattern manufacturing process using the CMP method incorporates tasks to increase productivity through the simplification of the manufacturing process, and to facilitate the manufacturing process by reducing the number of etching steps.

A conventional method for forming the interconnection of a semiconductor device will be described below with reference to the attached drawings.

Figs. 1a and 1b illustrate the manufacturing procedure of a conventional interconnection of a semiconductor device.

As illustrated in FIG. 1a, a lower conductive line 2 is formed on a semiconductor substrate 1. Also, a first insulating layer 3 is formed on the overall surface of the substrate and on the lower conductive line 2.

As illustrated in FIG. 1b, the first insulating layer 3 is planarized through a CMP process. Then, as illustrated in FIG. 1c, an etch stop layer 4 is formed on the first insulating layer 3. After a photosensitive layer (not shown) is coated on the etch stop layer 4, a specific portion of the etch stop layer 4 is removed by a photolithography and etching process to define a contact hole.

As illustrated in FIG. 1d, a second insulating layer is deposited on the overall surface of the substrate and on the etch stop layer 4. A second photosensitive layer 6 for patterning the upper conductive line to be formed in the following step is deposited on the second insulating layer 5.

After the second photosensitive layer 6 is patterned, the first and second insulating layers 3 and 5 are selectively removed through a photolithography and etching step to thereby expose a portion of the lower conductive line 2. Here, a contact hole is formed to electrically connect the upper conductive region to be formed in the following step to the lower conductive line 2. Then, as shown in FIG. 1e, the second photosensitive layer 6 is removed and an upper conductive line 7 is formed.

Nonetheless, the above-mentioned method for forming an interconnection of a conventional semiconductor device has the following problems.

First, the process is complicated. It is difficult to form and selectively etch the etch stop layer.

Second, when the etching process is carried out to form the contact hole, the lower conductive line must be exposed for a long time due to height difference considerations. This may cause damage to the exposed surface of the lower conductive line.

SUMMARY OF THE INVENTION

Accordingly, the present invention is directed to a method for forming interconnection of semiconductor device that substantially obviates one or more of the problems due to limitations and disadvantages of the related art.

The present invention aims to solve at least the aforementioned problems of the prior art. It is a goal of the present invention to provide a method of forming an interconnection for a semiconductor device suitable for preventing a conductive line from being damaged due to an etching process, for facilitating the manufacturing process, and for enhancing the productivity of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming interconnection of semiconductor device includes a method of forming an interconnection for a semiconductor device including the steps of: forming a lower conductive line on a semiconductor substrate and forming a first insulating layer on the semiconductor substrate and the lower conductive line; patterning the first insulating layer to form a first insulating layer pattern on the lower conductive line which is narrower than the lower conductive line; forming a second insulating layer on an overall surface of the substrate and on the first insulating layer pattern, to planarize a surface of the second insulating layer; patterning the second insulating layer to expose a surface of the first insulating layer pattern and to form a first trench wider than the first insulating layer pattern on an upper portion of the first insulating pattern; removing the first insulating layer pattern, to thereby form a second trench at a lower portion of the first trench; and filling the first and second trenches with conductive material, to thereby form an upper conductive line.

In another aspect, the method of forming an interconnection for a semiconductor device, the method comprising the steps of: forming a lower conductive line on a semiconductor substrate and forming a first insulating layer on the semiconductor substrate and the lower conductive line; patterning the first insulating layer to form a first insulating layer pattern on the lower conductive line which is narrower than the lower conductive line; depositing a second insulating layer on an overall surface of the substrate and on the first insulating layer pattern; depositing a third insulating layer on the second insulating layer to thereby planarize a surface of the third insulating layer; patterning at least the second insulating layer to expose a surface of the first insulating layer pattern and to form a first trench wider than the first insulating layer pattern on an upper portion of the first insulating layer pattern; removing at least a portion of the first insulating layer pattern, to thereby form a second trench at a lower portion of the first trench; and filling the first and second trenches with conductive material, to thereby form an upper conductive line.

In a further aspect, the method of forming an interconnection for a semiconductor device, the method comprising the steps of: forming a lower conductive lead on a semiconductor substrate; forming an insulating layer pattern, narrower than the lower conductive line, on the lower conductive line; forming an insulating layer over the insulating layer pattern and the substrate; patterning the insulating layer to expose a surface of the first insulating layer pattern and to form a first trench wider than the insulating layer pattern on an upper portion of the insulating layer pattern; removing the insulating layer pattern to thereby form a second trench at a lower portion of the first trench; and filling the first and second trenches with conductive material, to thereby form an upper conductive line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

Reference will now be made in detail to the preferred embodiments of the present invention, examples of which are illustrated in the accompanying drawings.

With reference to the attached drawings, a method for forming an interconnection of a semiconductor device in accordance with the present invention will be described as follows.

FIGS. 2a to 2f are sectional views showing the manufacturing procedure for a first embodiment of the invention.

Figure 1A:
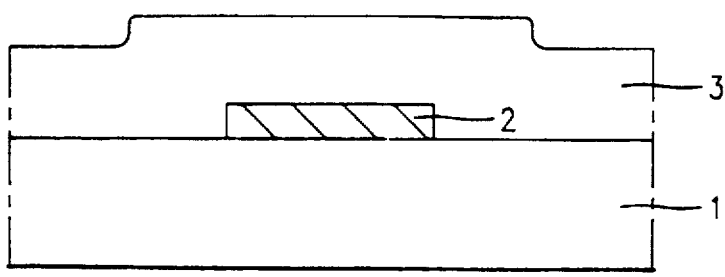
FIGS. 1a to 1e illustrate the manufacturing procedure for an interconnection of a conventional semiconductor device.
Figure 1B:
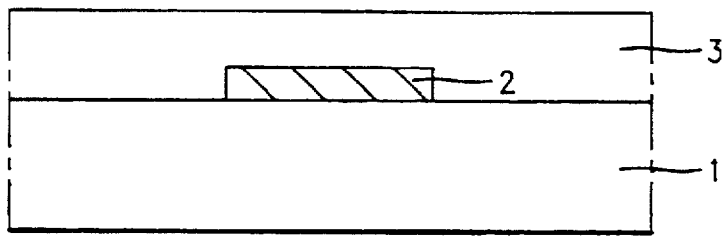
Figure 1C:
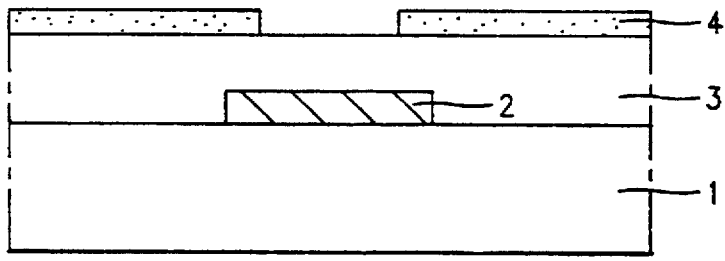
Figure 1D:
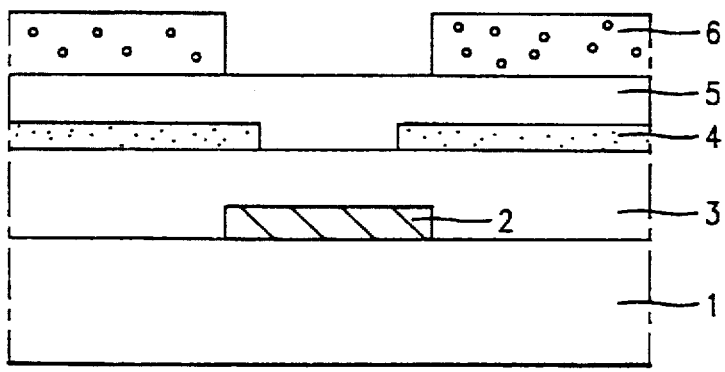
Figure 1E:
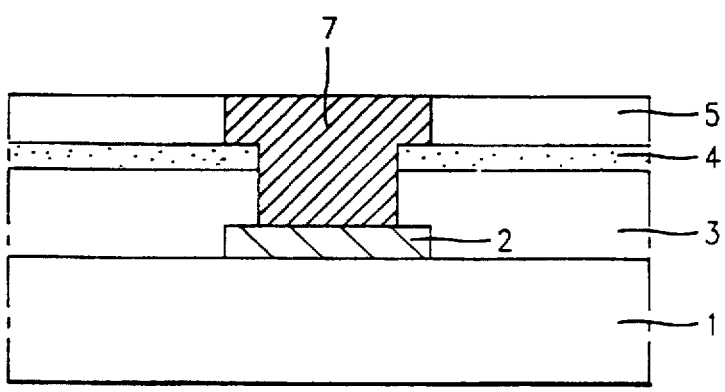
Figure 2A:
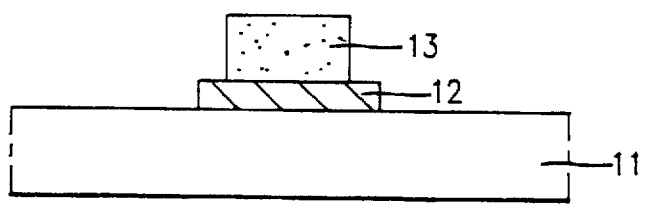
FIGS. 2a to 2f are sectional views showing the manufacturing procedure for an interconnection according to a first embodiment of the present invention.

As illustrated in FIG. 2a, a lower conductive line 12 is formed of a conductive material such as polysilicon, silicide, or metal, on a semiconductor substrate 11.

A first insulating pattern 13 is formed at a location where a contact hole is to be formed. The function of the contact hole is to electrically connect the lower conductive line 12 to an upper conductive line which will be formed in the following step, using a first photosensitive material such as polymer or polyimide. Here, the first insulating pattern 13 is formed higher than where the contact hole will be formed in the following step. The first photosensitive material is used as a "sacrificing" layer for the purpose of forming the first insulating pattern 13. It should be noted that, at this point, spin on glass (SOG) can be used instead of the aforementioned first photosensitive material.

Figure 2B:
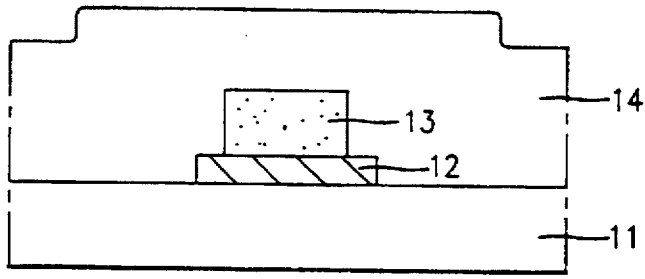

As illustrated in FIG. 2b, an insulating layer 14 used for planarization purposes is deposited on the overall surface of the substrate and on the first insulating layer 13.

The insulating layer 14 for planarization is formed at a temperature (e.g., 200° C.) where the first photosensitive material is not transformed, using tetraethyl orthosilicate (TEOS), flurotetraethylorthosilicate (FTES), or $SiH_4/O_2$. The insulating layer can be formed using a chemical vapor deposition (CVD) or plasma enhanced CVD method (PECVD) using electro-cycro resonance (ECR), and its thickness is about 5000 Å.

Figure 2C:
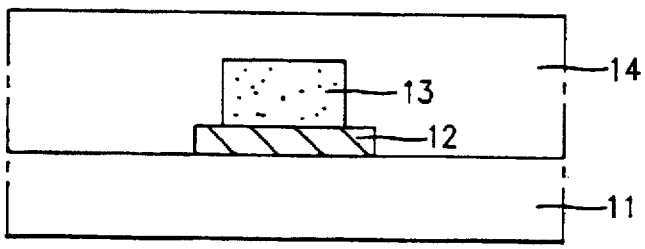

As illustrated in FIG. 2c, the insulating layer 14 is planarized by CMP. Here, a polishing process is performed for planarization using a polishing material including silica in a colloid state, and slurry including KOH at about 7 to 12 PH.

Figure 2D:
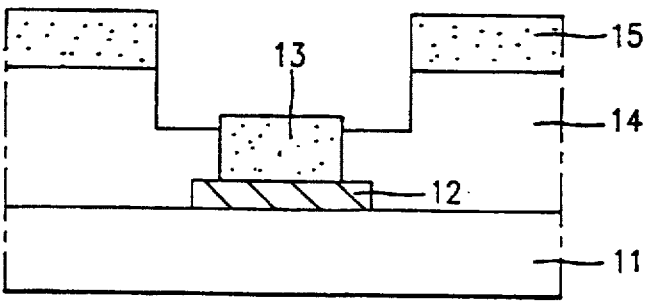

As illustrated in FIG. 2d, a second photosensitive material 15 is doped on the planarization insulating layer 14 to define the upper conductive line to be formed in the following step. The planarization insulating layer 14 is selectively removed by a reactive ion etch (RIE) method using a gas such as $CF_4$, $CHF_3$, or $O_2$.

Figure 2E:
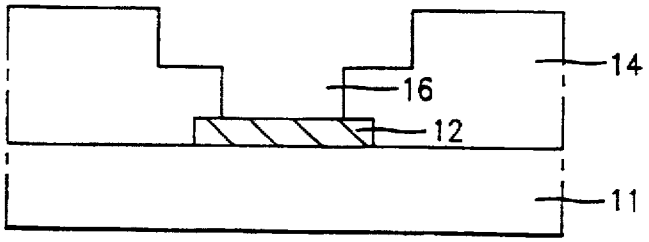

As illustrated in FIG. 2e, the second photosensitive material 15 and first insulating pattern 13 are simultaneously removed to form the upper conductive line 17 and contact hole 16. Here, portions of the insulating layer 14 are removed in consideration of the thickness of the line and the depth of the contact hole 16.

Figure 2F:
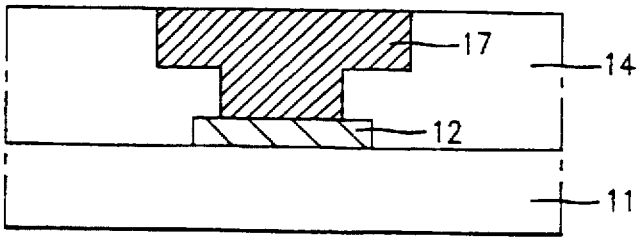

As illustrated in FIG. 2f, conductive material such as Al, Cu, Ti, TiN is deposited and patterned on the overall surface of the substrate, to form the upper conductive line 17.

FIGS. 3a to 3f are sectional views showing the manufacturing procedure for a second embodiment of the invention.

Figure 3A:
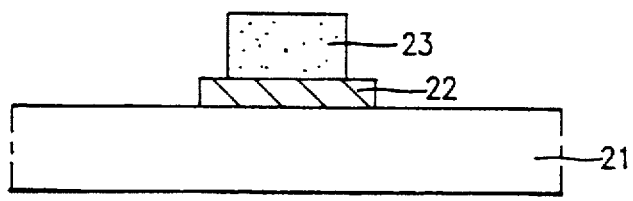
FIGS. 3a to 3f are sectional views showing the manufacturing procedure for an interconnection according to a second embodiment of the present invention.
Figure 3B:
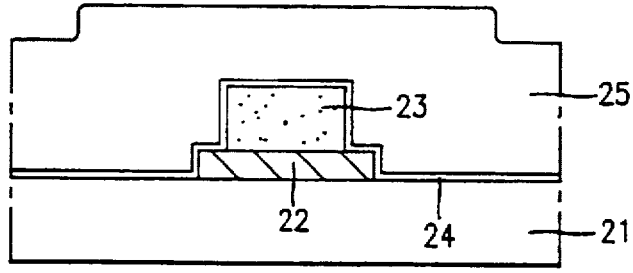

As illustrated in FIG. 3a, a lower conductive line 22 is formed of a conductive material such as polysilicon, silicide, or metal on a semiconductor substrate 21. A first insulating pattern 23 is formed at a location where a contact hole will be formed. The function of the contact hole will be to electrically connect the lower conductive line 22 to an upper conductive line which will be formed in the following step, using a first photosensitive material such as polymer or polyimide. A conforming second insulating layer 24 is deposited on the overall surface of the substrate and on the first insulating pattern 23, and an insulating layer 25 for planarization is deposited on the upper portion of the second insulating layer 24. The second insulating layer 24 and insulating layer 25 are formed by a CVD method, such as PECVD using an ECR device. The second insulating layer 24 prevents the photosensitive material used for the first insulating pattern 22 from being transformed. The second insulating layer formed at a thickness within a range of 500 to 2000 Å, at a temperature below 200° C., using TEOS, FTES or $SiH_4/O_2$.

Figure 3C:
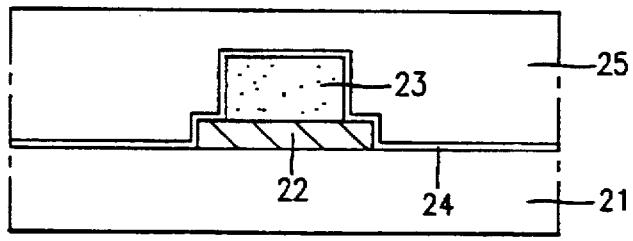

As illustrated in FIG. 3c, the insulating layer 25 is planarized by a CMP method. The polishing process is performed using a polishing material including silica in a colloid state, and slurry including KOH at about 7 to 12 PH.

Figure 3D:
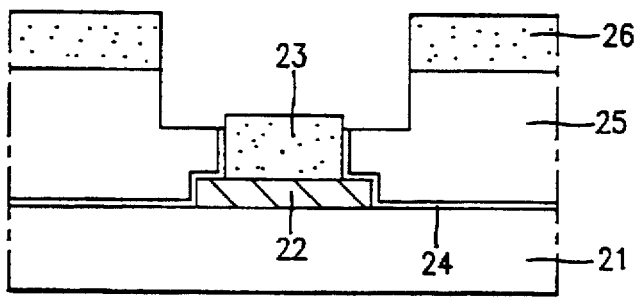

As illustrated in FIG. 3d, a second photosensitive material 26 is doped on the insulating layer 25 to define the upper conductive line which will be formed in the following step.

The insulating layer 25 and second insulating layer 24 are selectively removed by the RIE method, using a gas such as $CF_4$, $CHF_3$, or $O_2$.

Figure 3E:
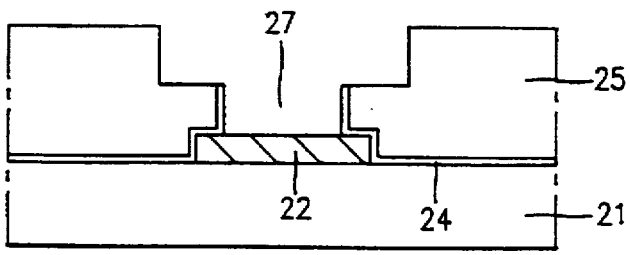

As illustrated in FIG. 3e, the second photosensitive material 26 and first insulating pattern 23 are simultaneously removed to form a contact hole 27. The contact hole will electrically connect the upper conductive line which will be formed in the following step, to the lower conductive line 22.

Figure 3F:
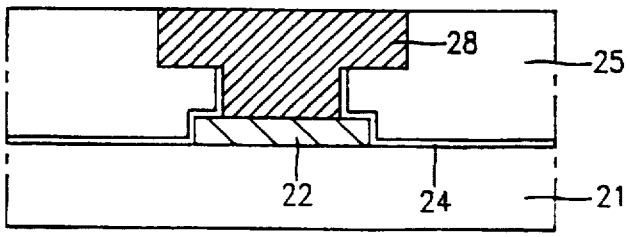

As illustrated in FIG. 3f, conductive material such as Al, Cu, Ti, or TiN, is deposited fully or selectively on the surface of the substrate to form the upper conductive line 28.

The method for forming an interconnection of a semiconductor device in accordance with the present invention has the following effects.

First, because the contact hole and line pattern are formed simultaneously, the invention prevents the lower conductive line from being damaged/in the etching step and, furthermore, enhances productivity.

Second, the line is formed without etching metal. This facilitates the manufacturing process.

It will be apparent to those skilled in the art that various modifications and variations can be made in the method for forming interconnection of semiconductor device of the present invention without departing from the spirit or scope of the invention. Thus, it is intended that the present invention cover the modifications and variations of this invention provided they come within the scope of the appended claims and their equivalents.

What is claimed is:

1. A method of forming an interconnection for a semiconductor device having a substrate, the method comprising the steps of:

forming a lower conductive line on the substrate;

forming a first insulating layer on the lower conductive line including the substrate;

patterning the first insulating layer to form a first insulating layer pattern on the lower conductive line, the first insulating layer pattern having a width narrower than the lower conductive line;

forming a second insulating layer on an overall surface of the substrate and on the first insulating layer pattern, to planarize a surface of the second insulating layer;

patterning the second insulating layer to expose a surface of the first insulating layer pattern and to form a first trench wider than the first insulating layer pattern on an upper portion of the first insulating layer pattern;

removing the first insulating layer pattern, to thereby form a second trench at a lower portion of the first trench; and filling the first and second trenches with conductive material, to thereby form an upper conductive line.

2. The method as claimed in claim 1, wherein the first insulating layer is formed from one of photosensitive material and spin on glass (SOG).

3. The method as claimed in claim 1, wherein the second insulating layer is formed using one of a chemical vapor deposition (CVD) and a plasma enhanced CVD (PECVD) method using an electro-cycro resonance (ECR) device.

4. The method as claimed in claim 1, wherein the planarized surface of the second insulating layer is planarized by using a chemical mechanical polishing (CMP) process.

5. The method as claimed in claim 1, wherein the second insulating layer is removed by using a reactive ion etch (RIE) process.

6. The method as claimed in claim 1, wherein the second insulating layer is formed at a temperature less than 200° C., using a material from among tetraethylorthosilicate (TEOS), flurotetraethylorthosilicate (FTES), and $SiH_4/O_2$.

7. The method as claimed in claim 1, wherein the upper conductive line is made of a material selected from Al, Cu, Ti, and TiN.

8. A method of forming an interconnection for a semiconductor device having a substrate, the method comprising the steps of:

forming a lower conductive line on the substrate and forming a first insulating layer on the substrate and the lower conductive line;

patterning the first insulating layer to form a first insulating layer pattern on the lower conductive line, the first insulating layer pattern having a width narrower than the lower conductive line;

depositing a second insulating layer on an overall surface of the substrate and on the first insulating layer pattern;

depositing a third insulating layer on the second insulating layer to thereby planarize a surface of the third insulating layer;

patterning at least the second and third insulating layers to expose a surface of the first insulating layer pattern and to form a first trench wider than the first insulating layer pattern on an upper portion of the first insulating layer pattern;

removing at least a portion of the first insulating layer pattern, to thereby form a second trench at a lower portion of the first trench; and filling the first and second trenches with conductive material, to thereby form an upper conductive line.

9. The method as claimed in claim 8, wherein the first insulating layer is formed from one of photosensitive material and spin on glass (SOG).

10. The method as claimed in claim 8, wherein at least the third insulating layer is formed using one of a chemical vapor deposition (CVD) and a plasma enhanced CVD (PECVD) method using an electro-cycro resonance (ECR) device.

11. The method as claimed in claim 8, wherein the planarized surface of the third insulating layer is planarized using a chemical mechanical polishing (CMP) process.

12. The method as claimed in claim 8, wherein at least the third insulating layer is removed using a reactive ion etch (RIE) process.

13. The method as claimed in claim 8, wherein the second and third insulating layers are formed of a material selected from among tetraethylorthosilicate (TEOS), flurotetraethylorthosilicate (FTES), and $SiH_4/O_2$ at a temperature less than 200° C.

14. The method as claimed in claim 8, wherein the upper conductive line is made of a material selected from Al, Cu, Ti, and TiN.

15. The method as claimed in claim 8, wherein at least the second insulating layer is formed to have a thickness of 500 to 2000 Å.

16. A method of forming an interconnection for a semiconductor device having a substrate, the method comprising the steps of:

forming a lower conductive lead on the substrate;

forming an insulating layer pattern on the lower conductive line, the insulating layer pattern having a width narrower than the lower conductive line;

forming an insulating layer over the insulating layer pattern and the substrate;

patterning the insulating layer to expose a surface of the insulating layer pattern and to form a first trench wider than the insulating layer pattern on an upper portion of the insulating layer pattern;

removing the insulating layer pattern to thereby form a second trench at a lower portion of the first trench; and filling the first and second trenches with conductive material, to thereby form an upper conductive line.

17. The method as claimed in claim 16, wherein the insulating layer pattern is formed from one of photosensitive material and spin on glass (SOG).

18. The method as claimed in claim 16, wherein the insulating layer is formed using one of a chemical vapor deposition (CVD) and a plasma enhanced CVD (PECVD) method using an electro-cycro resonance (ECR) device.

19. The method as claimed in claim 16, wherein the insulating layer is planarized using a chemical mechanical polishing (CMP) process.

20. The method as claimed in claim 16, wherein the insulating layer is removed by using a reactive ion etch (RIE) process.

* * * * *